(12) United States Patent
Huai et al.

(10) Patent No.: US 7,430,135 B2
(45) Date of Patent: Sep. 30, 2008

(54) CURRENT-SWITCHED SPIN-TRANSFER MAGNETIC DEVICES WITH REDUCED SPIN-TRANSFER SWITCHING CURRENT DENSITY

(75) Inventors: Yiming Huai, Pleasanton, CA (US); Zhitao Diao, Fremont, CA (US); Alex Panchula, San Carlos, CA (US); Eugene Youjun Chen, Fremont, CA (US); Lien-Chang Wang, Fremont, CA (US)

(73) Assignee: Grandis Inc., Milpitas, CA (US)

( * ) Notice: Subject to any disclaimer, the term of this patent is extended or adjusted under 35 U.S.C. 154(b) by 248 days.

(21) Appl. No.: 11/318,337

(22) Filed: Dec. 23, 2005

(65) Prior Publication Data

US 2007/0171694 A1    Jul. 26, 2007

(51) Int. Cl.
*G11C 11/00* (2006.01)

(52) U.S. Cl. .................. 365/158; 365/171; 365/173; 365/55

(58) Field of Classification Search ................. 365/158, 365/171, 173, 55
See application file for complete search history.

(56) References Cited

U.S. PATENT DOCUMENTS

| | | | |
|---|---|---|---|
| 5,695,864 | A | 12/1997 | Slonczewski |
| 6,137,662 | A | 10/2000 | Huai et al. |
| 6,146,775 | A | 11/2000 | Fujita et al. |
| 6,172,904 | B1 | 1/2001 | Anthony et al. |
| 6,175,476 | B1 | 1/2001 | Huai et al. |
| 6,201,673 | B1 | 3/2001 | Rottmayer et al. |
| 6,211,090 | B1 | 4/2001 | Durlam et al. |
| 6,222,707 | B1 | 4/2001 | Huai et al. |
| 6,266,218 | B1 | 7/2001 | Carey et al. |
| 6,351,355 | B1 | 2/2002 | Min et al. |
| 6,351,409 | B1 | 2/2002 | Rizzo et al. |
| 6,381,105 | B1 | 4/2002 | Huai et al. |
| 6,438,026 | B2 | 8/2002 | Gillies et al. |
| 6,447,935 | B1 | 9/2002 | Zhang et al. |
| 6,518,071 | B1 | 2/2003 | Durlam et al. |
| 6,545,906 | B1 | 4/2003 | Savtchenko et al. |
| 6,603,677 | B2 | 8/2003 | Redon et al. |
| 6,633,498 | B1 | 10/2003 | Engel et al. |
| 6,649,960 | B1 | 11/2003 | Cross |
| 6,687,098 | B1 | 2/2004 | Huai |

(Continued)

FOREIGN PATENT DOCUMENTS

JP    2006-093432    4/2006

(Continued)

OTHER PUBLICATIONS

Cowburn et al., "Lateral interface anisotropy in nanomagnets, Journal of Applied Physics," 87(9): 7067-7069 (May 1, 2000).

(Continued)

*Primary Examiner*—Richard T. Elms
*Assistant Examiner*—Han Yang
(74) *Attorney, Agent, or Firm*—Fish & Richardson P.C.

(57) ABSTRACT

Magnetic multilayer structures, such as magnetic or magnetoresistive tunnel junctions (MTJs) and spin valves, having one or more spin diffusion layers to diffuse the electron spins outside the MTJ or spin valve structure to reduce the spin transfer switching current for switching the free layer.

35 Claims, 7 Drawing Sheets

U.S. PATENT DOCUMENTS

| | | | |
|---|---|---|---|
| 6,714,444 B2 | 3/2004 | Huai et al. | |
| 6,771,534 B2 | 8/2004 | Stipe | |
| 6,791,868 B2 | 9/2004 | Gider et al. | |
| 6,829,161 B2 | 12/2004 | Huai et al. | |
| 6,838,740 B2 | 1/2005 | Huai et al. | |
| 6,847,547 B2 | 1/2005 | Albert et al. | |
| 6,888,704 B1 | 5/2005 | Diao et al. | |
| 6,888,742 B1 | 5/2005 | Nguyen et al. | |
| 6,893,741 B2 | 5/2005 | Doerner et al. | |
| 6,920,063 B2 | 7/2005 | Huai et al. | |
| 6,933,155 B2 | 8/2005 | Albert et al. | |
| 6,950,335 B2 | 9/2005 | Dieny et al. | |
| 6,958,927 B1 | 10/2005 | Nguyen et al. | |
| 6,967,863 B2 | 11/2005 | Huai | |
| 6,979,586 B2 | 12/2005 | Guo et al. | |
| 6,985,385 B2 | 1/2006 | Nguyen et al. | |
| 6,989,972 B1 | 1/2006 | Stoev et al. | |
| 6,992,359 B2 | 1/2006 | Nguyen et al. | |
| 7,006,375 B2 | 2/2006 | Covington | |
| 7,009,877 B1 | 3/2006 | Huai et al. | |
| 7,027,268 B1 | 4/2006 | Zhu et al. | |
| 7,057,921 B2 | 6/2006 | Valet | |
| 7,088,609 B2 | 8/2006 | Valet | |
| 7,098,494 B2 | 8/2006 | Pakala et al. | |
| 7,105,372 B2 | 9/2006 | Min et al. | |
| 7,106,624 B2 | 9/2006 | Huai et al. | |
| 7,110,287 B2 | 9/2006 | Huai et al. | |
| 7,224,601 B2 | 5/2007 | Panchula et al. | |
| 2002/0015823 A1 | 2/2002 | Mauler et al. | |
| 2002/0105827 A1 | 8/2002 | Redon et al. | |
| 2004/0130936 A1 | 7/2004 | Nguyen et al. | |
| 2004/0136231 A1 | 7/2004 | Huai et al. | |
| 2004/0170055 A1 | 9/2004 | Albert et al. | |
| 2004/0235201 A1 | 11/2004 | Albert et al. | |
| 2005/0041342 A1 | 2/2005 | Huai et al. | |
| 2005/0063222 A1 | 3/2005 | Huai et al. | |
| 2005/0106810 A1 | 5/2005 | Pakala et al. | |
| 2005/0136600 A1 | 6/2005 | Huai | |
| 2005/0184839 A1 | 8/2005 | Nguyen et al. | |
| 2005/0237787 A1 | 10/2005 | Huai et al. | |
| 2005/0254286 A1* | 11/2005 | Valet | 365/158 |
| 2005/0254287 A1* | 11/2005 | Valet | 365/158 |
| 2006/0018057 A1 | 1/2006 | Huai et al. | |
| 2006/0049472 A1 | 3/2006 | Diao et al. | |
| 2006/0081953 A1 | 4/2006 | Nguyen et al. | |
| 2006/0102969 A1 | 5/2006 | Huai et al. | |
| 2006/0114618 A1 | 6/2006 | Masanori et al. | |
| 2006/0128038 A1 | 6/2006 | Pakala et al. | |
| 2006/0141640 A1 | 6/2006 | Huai et al. | |
| 2006/0192237 A1 | 8/2006 | Huai | |
| 2006/0221676 A1 | 10/2006 | Qian et al. | |
| 2006/0281258 A1 | 12/2006 | Dieny et al. | |
| 2007/0063236 A1 | 3/2007 | Huai et al. | |
| 2007/0063237 A1 | 3/2007 | Huai et al. | |

FOREIGN PATENT DOCUMENTS

| | | |
|---|---|---|
| WO | WO2007/035786 | 3/2007 |
| WO | WO2007/075889 | 7/2007 |

OTHER PUBLICATIONS

Inomata et al., "Size-independent spin switching field using synthetic antiferromagnets," Applied Physics Letters 82(16): 2667-2669 (Apr. 21, 2003).

Leighton et al., "Coercivity Enhancement in Exchange Biased Systems Driven by Interfacial Magnetic Frustration," Physical Review Letters 84(15): 3466-3469 (Apr. 10, 2000).

Slonczewski, et al., "Current-driven excitation of magnetic multilayers", *Journal of Magnetism and Magnetic Materials*, vol. 159, pp. L1-L7, 1996.

Berger, "Emission of Spin Waves by a magnetic multilayer traversed by a current", *Physical Review B*, vol. 54, No. 13, pp. 9353-9358, Oct. 1, 1996.

Albert, et al., "Spin-polarized current switching of a Co thin film nanomagnet", *Applied Physics Letters*, vol. 77, No. 23, pp. 3809-3811, Dec. 4, 2000.

Doi, et al., "Magnetism of $Co_{1-x}Fe_x$-NOL in Specular Spin-Valves", *IEEE Transactions on Magnetics*, vol. 40, No. 4, pp. 2263-2265, Jul. 2004.

Zhang, et al., "40% tunneling magnetoresistance after anneal at 380 C for tunnel junctions with iron-oxide interface layers", *Journal of Applied Physics*, vol. 89, No. 11, pp. 6665-6667, Jun. 1, 2001.

Devolder, T. et al., "Instability threshold versus switching threshold in spin-transfer-induced magnetization switching", Physical Review B71; 184401-1-184401-6 (2005).

Mancoff, F.B. et al., "Phase-locking in double-point-contact spin-transfer devices", Nature, vol. 437:393-395 (2005).

Sharrock, M.P. et al., "Kinetic Effects in Coercivity Measurements", IEEE Transactions on Magnetics, vol. Mag-17, No. 6:3020-3022 (1981).

Thirion, C. et al., "Switching of magnetization nonlinear resonance studied in single nanoparticles", Nature Publishing Group, www.nature.com/naturematerials, vol. 2, 524-527 (2003).

Xi, Haiwen et al., "Spin-current effect on ferromagnetic resonance in patterned magnetic thin film structures", J. of Applied Physics 97, 033904 (2005).

Tulapurkar, et al., "Subnanosecond magnetization reversal in magnetic nanopillars by spin angular momentum transfer", *Applied Physics Letters*, vol. 85, No. 22, pp. 5358-5360, Nov. 29, 2004.

Cowache et al., "Spin-valve structures with NiO pinning layers," IEEE Transactions on Magnetics, vol. 34, Iss. 4, part 1, (Jul. 1998) [abstract only].

Dokupil et al., Magnetostriction in combination with GMR/TMR-structures [online] Jun. 2, 2005, [retrieved pn Sep. 5, 2007] <URL: http://www.science24.com/paper/3919> [abstract only].

* cited by examiner

CURRENT-SWITCHED SPIN-TRANSFER MAGNETIC DEVICES WITH REDUCED SPIN-TRANSFER SWITCHING CURRENT DENSITY

BACKGROUND

This application relates to magnetic materials and structures having at least one free ferromagnetic layer.

Various magnetic materials use multilayer structures which have at least one ferromagnetic layer configured as a "free" layer whose magnetic direction can be changed by an external magnetic field or a control current. Magnetic memory devices may be constructed using such multilayer structures where information is stored based on the magnetic direction of the free layer.

One example for such a multilayer structure is a magnetic or magnetoresistive tunnel junction (MTJ) which includes at least three layers: two ferromagnetic layers and a thin layer of a non-magnetic insulator as a barrier layer between the two ferromagnetic layers. The insulator for the middle barrier layer is not electrically conducting and hence functions as a barrier between the two ferromagnetic layers. However, when the thickness of the insulator is sufficiently thin, e.g., a few nanometers or less, electrons in the two ferromagnetic layers can "penetrate" through the thin layer of the insulator due to a tunneling effect under a bias voltage applied to the two ferromagnetic layers across the barrier layer. Notably, the resistance to the electrical current across the MTJ structure varies with the relative direction of the magnetizations in the two ferromagnetic layers. When the magnetizations of the two ferromagnetic layers are parallel to each other, the resistance across the MTJ structure is at a minimum value $R_P$. When the magnetizations of the two ferromagnetic layers are anti-parallel with each other, the resistance across the MTJ is at a maximum value $R_{AP}$. The magnitude of this effect is commonly characterized by the tunneling magnetoresistance (TMR) defined as $(R_{AP}-R_P)/R_P$.

The relationship between the resistance to the current flowing across the MTJ and the relative magnetic direction between the two ferromagnetic layers in the TMR effect may be used for nonvolatile magnetic memory devices to store information in the magnetic state of the MTJ. Magnetic random access memory (MRAM) devices based on the TMR effect, for example, may be an alternative of and compete with electronic RAM devices. In such devices, one ferromagnetic layer is configured to have a fixed magnetic direction and the other ferromagnetic layer is a "free" layer whose magnetic direction can be changed to be either parallel or opposite to the fixed direction and thus operate as a recording layer. Information is stored based on the relative magnetic direction of the two ferromagnetic layers on two sides of the barrier of the MTJ. For example, binary bits "1" and "0" may be recorded as the parallel and anti-parallel orientations of the two ferromagnetic layers in the MTJ. Recording or writing a bit in the MTJ can be achieved by switching the magnetization direction of the free layer, e.g., by a writing magnetic field generated by supplying currents to write lines disposed in a cross stripe shape, by a current flowing across the MTJ based on the spin transfer effect, or by other means. In the spin-transfer switching, the current required for changing the magnetization of the free layer can be small (e.g., 0.1 mA or lower) and can be significantly less than the current used for the field switching. Therefore, the spin-transfer switching in a MTJ can be used to significantly reduce the power consumption of the cell.

SUMMARY

The device designs and techniques described in this application are, at least in part, based on the recognition that the reduced current for switching the free layer via the spin-transfer effect can allow for the physical dimension of the transistor that supplies the current to be reduced. This reduction in the transistor size can be used to increase the number of transistors and MTJ cells per unit area on a chip. The examples described in this application include magnetic or magnetoresistive tunnel junctions (MTJs) and other magnetic multilayer structures that manipulate the spins of the electrons outside the free layer via an electron diffusion drift process to enhance the efficiency of the spin dependent current in switching of the magnetization direction of the free layer in a magnetic multilayer structure. Accordingly, the threshold current for switching the free layer can be reduced due to the enhanced efficiency. Such MTJs and other magnetic multilayer structures may be used in various applications, including magnetic memory cells in highly integrated circuits such as high-density integrated MRAM chips based on CMOS processing.

In one example, a device is described to include a free ferromagnetic layer having a magnetization direction that is changeable, a pinned ferromagnetic layer having a magnetization direction fixed along a predetermined direction, a middle layer formed between the free and pinned ferromagnetic layers; and a spin diffusion layer located next to the free ferromagnetic layer and outside a structure formed by the free and pinned ferromagnetic layers and the middle layer. The spin diffusion layer interacts with electrons to diffuse electron spins.

In another example, a method is described to operate a magnetic tunnel junction (MTJ). A write current is directed through a magnetic tunnel junction (MTJ) to change a magnetization direction of the MTJ. The write current comprises at least one write pulse with a write pulse amplitude and a write pulse sufficient to change the magnetization direction. In reading the MTJ, a read current is directed through the MTJ without changing the magnetization direction and the read current comprises at least one read pulse with a read pulse amplitude less than the write pulse amplitude and a read pulse width less than the write pulse width.

These and other implementations, their variations and modifications are described in greater detail in the attached drawings, the detailed description, and the claims.

DETAILED DESCRIPTION

The techniques described in this application may be applied to a variety of magnetic multilayer structures that uses a current to switch the magnetization direction of the free layer via the spin transfer effect. An MTJ is only one example of such structures. Another example of such a multilayer structure having a free ferromagnetic layer is a spin valve structure which can also be used in magnetic memory devices and other magnetic devices. The spin valve can include two ferromagnetic layers and a thin layer of a non-magnetic metal layer as a spacer layer between the two ferromagnetic layers. Similar to MTJs, one ferromagnetic layer is fixed and the other is a free layer. The free layer in the spin valve is subject to the similar stability issues as in MTJs. The following examples use MTJs as examples to illustrate the designs, examples, and operations of various structures that manipulate the spins of electrons outside the free layer.

Figure 1:
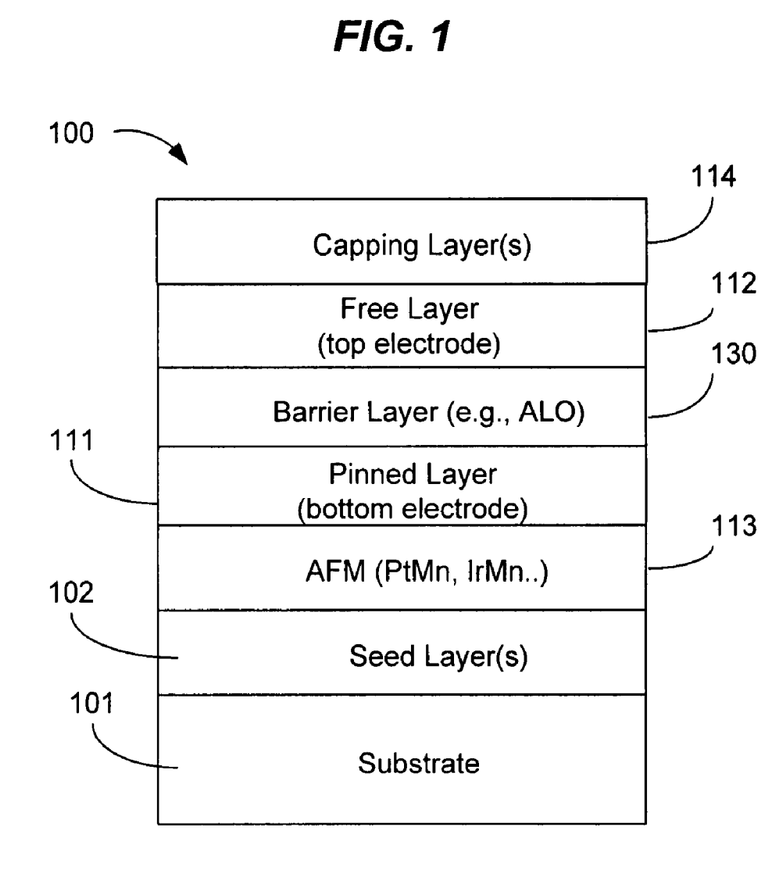
FIG. 1 shows one example of a MTJ cell structure without a spin diffusion layer.

FIG. 1 illustrates an example of a MTJ 100 formed on a substrate 101 such as a Si substrate. The MTJ 100 is constructed on one or more seed layers 102 directly formed on the substrate 101. On the seed layers 102, an antiferromagnetic (AFM) layer 113 is first formed and then a first ferromagnetic layer 111 is formed on top of the AFM layer 113. After the post annealing, the ferromagnetic layer 111 later is pinned with a fixed magnetization. In some implementations, this fixed magnetization may be parallel to the substrate 101 (i.e., the substrate surface). On top of the first ferromagnetic layer 111 is a thin insulator barrier layer 130 such as a metal oxide layer. In the MTJ 100, a second ferromagnetic layer 112 is formed directly on top of the barrier layer 130. In addition, at least one capping layer 114 is formed on top of the second ferromagnetic layer 112 to protect the MTJ.

The magnetization of the ferromagnetic layer 112 is not pinned and can be freely changed to be parallel to or anti-parallel to the fixed magnetization of the pinned layer 111 under a control of a driving current perpendicularly flowing through the MTJ. For this reason, the layer 112 is a free layer (FL). An electric current, whose electrons carry polarized spins, is applied across the junction in the current operating range and the interaction of the electron spins and the free layer 112 can force the magnetization of the free layer 112 to be substantially parallel to or substantially opposite to the fixed magnetization of the pinned layer 111. Many magnetic systems have competing energy contributions that prevent a perfect parallel or antiparallel alignment of the magnetic domains or nanomagnets in each ferromagnetic layer. In MTJs, the dominant contribution to the energy state of the nanomagnets within the free layer 112 tends to force the nanomagnets into the parallel or antiparallel alignment, thus producing a substantial parallel or antiparallel alignment.

The threshold current that is sufficient to switch the magnetization direction of the free layer 112 has been reduced as the device density grows with the decrease in the dimension of the MTJ cell in a manner compatible to the semiconductor or CMOS technology evolution to some extent. The reduction of the spin-transfer switching current density Jc is achievable to about $10^6$ A/cm$^2$ or less and thus it is now possible to apply the spin transfer switching to high density MRAM devices. This level of the low spin-transfer switching current density Jc allows for 1) low power consumption and 2) small (isolation) transistor dimension that is proportional to the saturation current. The current required for changing the magnetization direction of the free layer 112 can be as small as 0.1 mA in some MTJ devices and is much lower than the scheme utilizing magnetic field created by a driving current, significantly reducing the power consumption. In addition, the degree of integration of such current-switched MTJ devices can be approximately equal to that of DRAM and; the write and readout time are expected to be comparable to that of SRAM. Therefore, magnetic memory devices based on current-switched MTJ cells can soon compete with electronic DRAM and SRAM devices in a wide range of applications.

For practical applications in high density and logic process compatibility, the critical switching current density in memory devices using current-switched MTJ cells needs to be further reduced by approximately one order of magnitude from $10^6$ A/cm$^2$. The change in the fabrication technology from the prior use of AlOx amorphous materials in the insulator barrier layer of MTJs to the crystallized MgO insulating barrier in a basic MTJ structure has contributed to a reduction of critical switching current density by 2-3 times to the level of about $10^6$ A/cm$^2$ in MTJs that use CoFeB free layers with relatively low magnetic moments. This manipulation of the insulator barrier layers to improve the spin transfer efficiency, however, may not be sufficient to achieve the desired reduction in the switching current by one order of magnitude in various MTJ designs.

The present techniques are designed to manipulate the diffusion of electron spins to further improve the spin transfer efficiency by using one or more spin diffusion layers outside the MTJ structure. The spin diffusion layer may be made of a material that destroys the spin polarization of the electrons via diffusion. In implementations, the spin diffusion layer may include a material that exhibits a short spin diffusion length less than, e.g., $10^2$ angstroms, to cause spin polarized electrons to lose their spin polarizations shortly after entering the spin diffusion layer. In addition, the spin diffusion layer may also operate to reduce the damping of the free layer and thus increase the switching speed of the free layer.

Figure 2A:
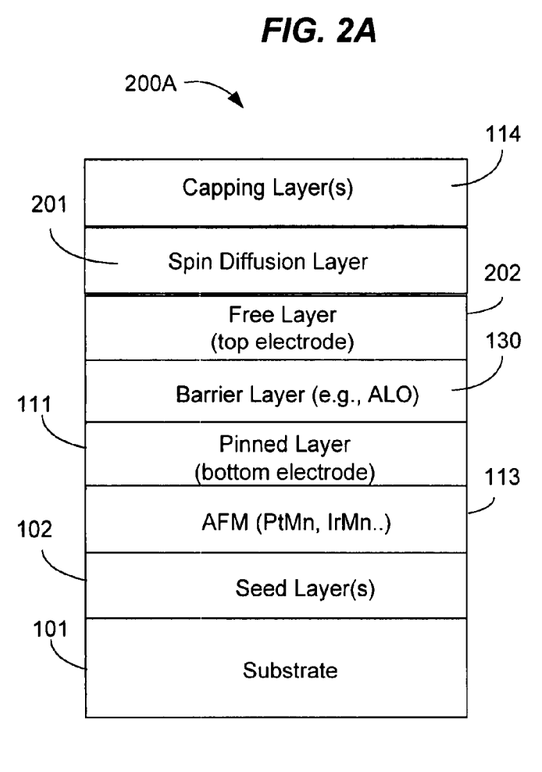
FIGS. 2A, 2B, 3A, 3B and 4 show examples of MTJs and spin valves with one or more spin diffusion layers to reduce the spin transfer switching current.

FIG. 2A illustrates one example of a MTJ cell 200A that implements a spin diffusion layer 201 on the top of the free layer 202. The spin diffusion layer 201 may be made of a material with a short spin diffusion length less than $10^2$ angstroms. As an example, copper is known to have a long spin diffusion length from approximately 200 to 400 angstroms. The spin diffusion layer 201 may include a non-magnetic metallic material to have a short spin diffusion length of several angstroms or less (e.g., less than 5 angstroms). For example, the spin diffusion layer 201 may include at least one of Pt, Pd, PtMn, Py, Au, Ag, V, Rd, Ru and others. The spin diffusion layer 201 operates to provide spin-flip scattering centers or outer boundaries with featured reduced spin accumulation within these regions. As a result, the spin dependent current flowing through the MTJ diminishes in the layers outside the free layer so that most of the spin dependent current is confined in the magnetically active central part of a MTJ stack. This increases the spin transfer torque on the free layer 202 and can reduce the critical switching current density.

Figure 2B:
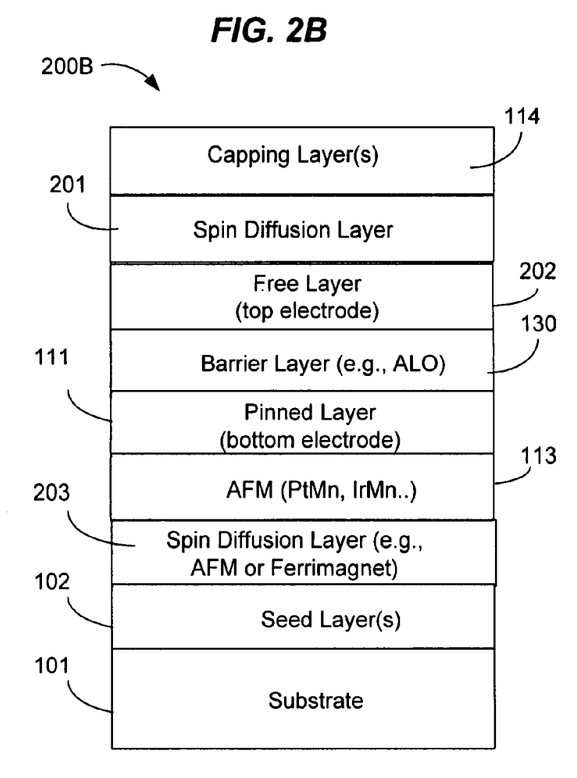

FIG. 2B shows another MTJ cell 200B that implements a second, additional spin diffusion layer 203 between the AFM layer 113 and the seed layer 102. The material for the spin diffusion layer 203 may be similar to that of the spin diffusion layer 201 on the top of the free layer 202. The two spin diffusion layers 201 and 203 on both sides of the MTJ structure jointly confine the spin dependent current in the MTJ structure to increase the spin transfer toque on the free layer 202.

The presence of the spin diffusion layer near the free layer or the AFM layer may cause atoms or other particles in the spin diffusion layer to diffuse into the adjacent free layer or the AFM layer. The diffusion may occur during the deposition of the layers and during any post-deposition processing such as an annealing process under a high temperature. Notably, such diffusion may contaminate the free layer or the AFM layer and thus degrade the magnetic properties of the free layer or the AFM layer. Therefore, inter-diffusion and intermixing between the free layer (or the AFM layer) and the spin diffusion layer are not desirable and should be minimized when possible.

In recognition of the above, a physical diffusion barrier layer may be fabricated between the free layer (or the AFM layer) and the spin diffusion layer as a barrier to any diffusion to mitigate or minimize inter-diffusion and intermixing between the free layer and the short spin diffusion length layer during the MTJ deposition and post deposition processing including high temperature annealing. The composition of the diffusion barrier layer may be selected according to the materials used for the free layer (or AFM layer) and the spin diffusion layer. In some implementations, the diffusion barrier layer may include a non-magnetic metallic material such as Ru, Ir, Ta and others.

Figure 3A:
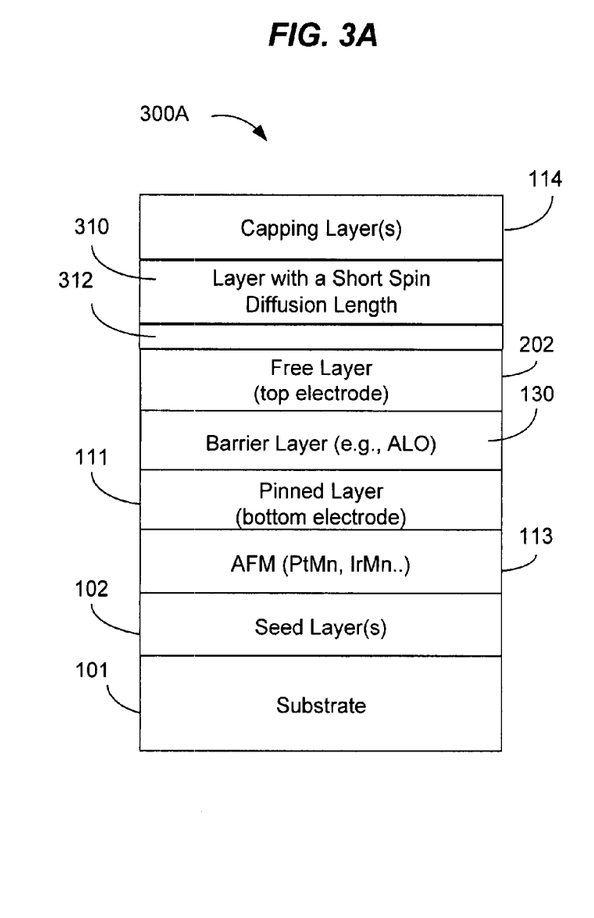
Figure 3B:
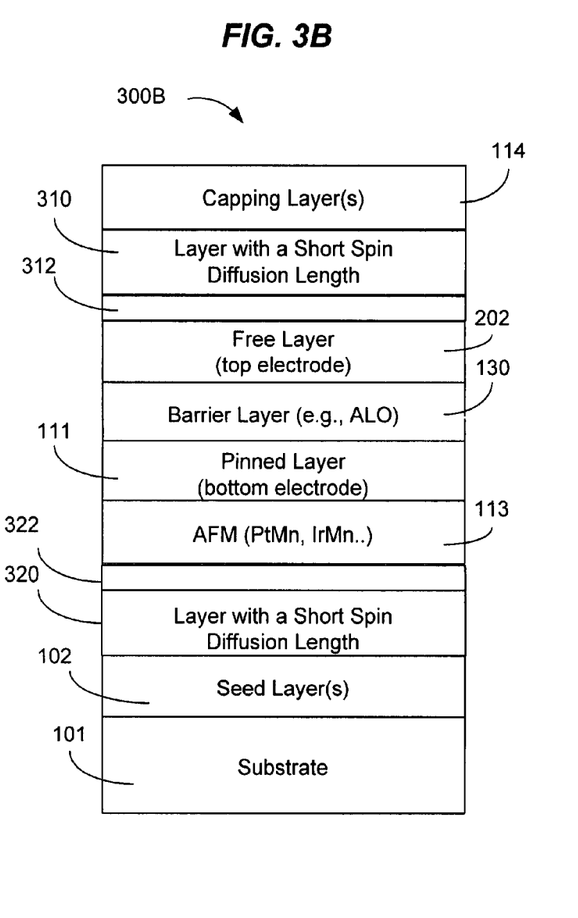

FIGS. 3A and 3B illustrate two examples of MTJ structures that implement a spin diffusion layer and an adjacent diffusion barrier layer. In FIG. 3A, the MTJ structure 300A includes two sublayers 310 and 312 on the top of the free layer 202. The sublayer 310 is a spin diffusion layer with a short spin diffusion length and the sublayer 312 is a diffusion barrier layer placed between the sub layer 310 and the free layer 202. The sublayer 310 operates on one side of the free layer 202 to confine the spin dependent current at the free layer 202. In FIG. 3B, the MTJ structure 300B further includes another spin diffusion layer 320 and a corresponding diffusion barrier layer 322 between the AFM layer 113 and the seed layer 102 on the other side of the MTJ structure.

In the examples illustrated in FIGS. 2A and 3A, a spin diffusion layer is shown to be on top of the free layer 202. Different from the examples in FIGS. 2B and 3B, there is not a spin diffusion layer formed on the other side of the MTJ structure. However, the AFM layer 113 on the bottom of the pinned layer 111 may be made of a material that can also operate as a spin diffusion layer by, e.g., having a short spin diffusion length. This design can enhance the spin transfer torque on the free layer 202 without requiring a separate second spin diffusion layer on the bottom of the MTJ.

Various examples for various layers in MTJs or spin valves with one or more spin diffusion layers are described below.

1. Free Layer

The free layers (FL) are Co, Fe, Ni or their alloys with crystalline structure or with amorphous states modified by boron or other amorphous forming elements addition at different composition (0-30 at. %). The saturation magnetization of the free layer can be adjusted between 400-1500 emu/cm$^3$ by varying the composition of amorphous forming elements. The layer thickness may be controlled so that the output signal (while optimizing current induced switching) remains at an acceptable level.

The free layer could be a single layer or a multiple layer configuration. For a single layer case, a ferromagnetic or ferrimagnetic material can be used. The individual layers of the multiple layer configurations could be either a combination of magnetic materials, which are either ferromagnetic or ferrimagnetic, or a combination of magnetic and non-magnetic layers (such as synthetic anti-ferromagnetic where two ferromagnetic layers are separated by a non-magnetic spacer). The spacer layer used in this synthetic structure also provides advantage of a diffusion stop layer against the possible diffusion of Mn element used in an antiferromagnetic layer into a barrier layer. The ferromagnetic layers could be Co, CoFe(5-40%), CoFe(5-40%)B(5-30%) CoFe(5-40%)Ta(5-30%), NiFe(~20%), CoPt(5-40%), CoPd(5-40%), FePt(5-40%), Co$_2$Mn(Al, Si) or Co$_2$(Cr,Fe) (Al, Si). Ferrimagnetic layers could be CoGd(15-35%) or FeGd(10-40%). The non-magnetic spacer could be Ru, Re or Cu. All compositions are in atomic percent.

2. Pin Layer

The pin layer (PL) may be made from Co, Fe, Ni or their alloys with crystalline structure or with amorphous states modified by boron or other amorphous forming elements addition at different composition (0-30 at. %). The pin layer could be a single layer or a multiple layer configuration. For a single layer case, a ferromagnetic or ferrimagnetic material can be used. The individual layers of the multiple layer configurations could be either a combination of magnetic materials, which are either ferromagnetic or ferrimagnetic, or a combination of magnetic and non-magnetic layers (such as synthetic anti-ferromagnetic where two ferromagnetic layers are separated by a non-magnetic spacer). The ferromagnetic layers could be Co, CoFe(5-40%), CoFe(5-40%)B(5-30%) CoFe(5-40%)Ta(5-30%), NiFe(~20%), CoPt(5-40%), CoPd(5-40%), FePt(5-40%), Co$_2$Mn(Al, Si) or Co$_2$(Cr, Fe)(Al, Si). Ferrimagnetic layers could be CoGd(15-35%) or FeGd(10-40%). The non-magnetic spacer could be Ru, Re or Cu. All compositions are in atomic percent.

3. Barrier Layer

The tunneling barrier layer could be either single layers of AlO(40-70%), MgO(30-60%), AlO(40-70%)N(2-30%), AlN(30-60%) and Al(Zr, Hf, Ti, Ta)O or a multilayer of the above films with crystalline structure or with amorphous states. The barrier layers with thickness between 5 Å and 40 Å are processed by depositing original metal starting material and then oxidizing the deposited films using natural oxidation and/or plasma oxidation, or by rf sputtering original oxide starting material so that there is tunneling current across the barrier. The resistance-area product range of the barrier is between 10 and 100 $\Omega$-$\mu$m$^2$. The structure of the interfaces between the barrier and free layer as well as the barrier and the pinned layer are optimized to get maximum spin polarization of electrons (polarization >40%) as well as maximum tunneling magneto-resistance (TMR) values (e.g., TMR >20%).

4. Spacer Layer

In a spin valve cell, the barrier layer 130 described above for MTJ cells is replaced by a non-magnetic metal spacer layer. Examples for the spacer material include Cu, Ag, Pt, Ru, Re, Rh, Ta, Ti, combinations of two or more these metals, or alloys of these metals. The non-magnetic spacer layer may be made of one or more of the above metals in combination with a nano-oxide (NOL) layer or current confinement layer insertion. In some implementations, the non-magnetic spacer may be formed by first depositing original metal starting material and then oxidizing the deposited films using natural oxidation and/or plasma oxidation, or by rf sputtering an original oxide starting material. The starting metal material may use the materials similar to pin or free layer material such as magnetic material CoFe, CoFeB, and non magnetic material Al, Ta, Ru, and Ti. The current confinement layer could be Cu/CoFe, FeSi, Al, Ta, Ru or Ti/NOL/Cu for instance.

The MTJ cells shown in FIGS. 1 through 3B use a "bottom MTJ" configuration where the pinned ferromagnetic layer 111 is located between the barrier layer 130 and the substrate 101. Alternatively, the free layer 202 may be placed under the barrier layer 130 and above the substrate 101 in a "top MTJ" configuration where the spin diffusion layer is placed between the free layer 202 and the seed layer 102.

Figure 4:
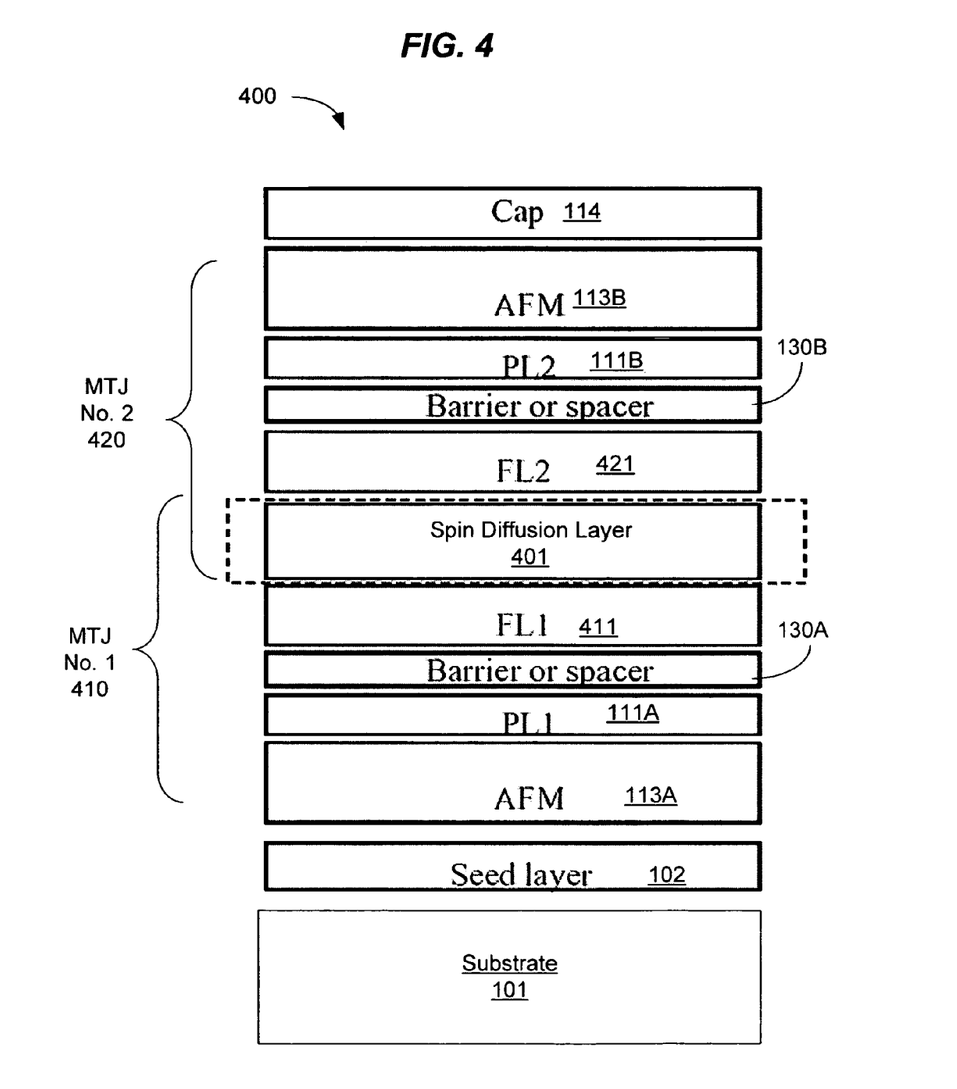

More complex structures may be constructed based on the above MTJs with one or more spin diffusion layers. FIG. 4 shows a dual MTJ structure 400 where two MTJs 410 and 420 are stacked over each other and share a common spin diffusion layer 401. In this example, the first MTJ 410 has a pinning AFM layer 113A directly formed on the top of the seed layers 102 and other layers of the MTJ 410, the pinned layer 111A, the barrier layer 130A, the free layer 411 and the spin diffusion layer 401, are sequentially placed above the AFM layer 113A. The spin diffusion layer 401 for the MTJ 410 is also the spin diffusion layer for the MTJ 420 which includes a free layer 421, a barrier layer 130B, a pinned layer 111B and a pinning AFM layer 113B that are sequentially placed on top of the spin diffusion layer 401. One or more capping layers 114 are then formed on the top of the MTJ 420. In addition, two diffusion barrier layers may be formed on two sides of the spin diffusion layer 401 to separate it from the two free layers 411 and 421. Additional spin diffusion layers may also be formed on the other sides of the AFM layers 113A and 113B.

As suggested in FIG. 4, the barrier layer 130A or 130B may also be a spacer metal layer when a spin valve is used. For example, the top MTJ 420 may be configured as a spin valve by using a non-magnetic metal as a spacer layer to replace the barrier layer 130B so that the device in FIG. 4 is a device with stacked MTJ and spin valve. In each of the above illustrated examples, a MTJ structure may be replaced by a spin valve structure where the barrier insulator layer in the MTJ is replaced by a non-magnetic metal spacer layer.

Magnetic devices with one or more free layers that implement spin diffusion layers can reduce the spin transfer switching current in comparison with similar constructed devices without the spin diffusion layers. The reduced switching current allows the transistor which supplies the switching current to be small. The combination of the reduced power consumption and reduced transistor dimension due to the presence of spin diffusion layers is attractive for ultra high density MRAM applications because the CMOS size is dictated by the spin transfer switching current density of the individual magnetic cell. A magnetic cell with lower spin transfer switching current requires smaller driving current from a select CMOS circuit that features a scaling down of the size of a CMOS, serving to achieve ultrahigh density of MRAM devices. In another aspect, the reduced spin transfer switching current in magnetic devices with the spin diffusion layers can facilitate compatibility between the magnetic cell integration and the logic integration process based on the same fabrication technology. If the spin transfer switching current density of a magnetic cell is not sufficiently small, more advanced lithographic technology is needed to pattern a smaller magnetic cell size to compromise the driving force provided by a CMOS device based on a larger CMOS technology node. Thus the integration process for the magnetic cell and the integration process for the logic device are not compatible with each other. This incompatibility is not desirable in part because of increased complexity in fabrication and the increased production cost. The use of the spin diffusion layers can be used to reduce the spin transfer switching current density of a magnetic cell sufficiently small to allow for the sizes of a magnetic cell and a CMOS transistor to be scaled down on an equal foot based on the same lithographic technology.

In addition, the reduced spin transfer switching current density of a magnetic cell by using the spin diffusion layers can be used to make the resistance of the magnetic cell comparable with that of the select CMOS. A small spin transfer switching current provides a large margin between the operation voltage on the cell and the intrinsic breakdown voltage of an insulating barrier in the MTJ stack that sets a limitation of the current a magnetic cell can carry out. This large margin is beneficial and can improve the reliability of magnetic cell devices.

Figure 5:
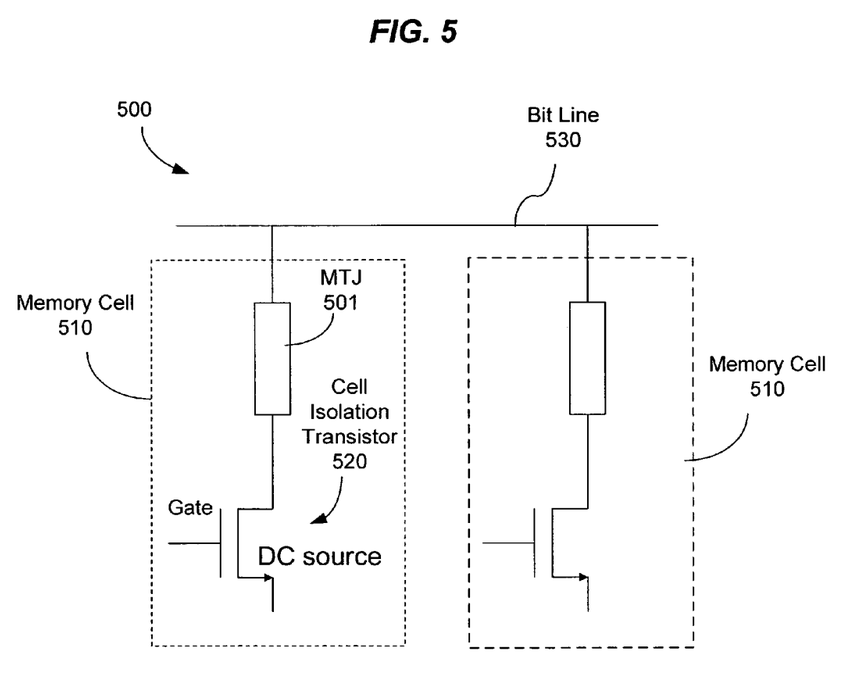
FIG. 5 shows an example of a memory array device that implements a MTJ cell based on one of the designs shown in FIGS. 1 through 4.

FIG. 5 shows an example of a current switched spin-transfer MRAM device 500 having an array of memory cells 510 where an MTJ 501 in each cell 510 is connected to an isolation/write transistor 520 and a bit line 530. Switching via the spin-transfer occurs when a DC current, passing through a magnetic layer of the magnetic tunnel junction 501, becomes spin polarized and imparts a spin torque on the free layer of the MTJ. When a sufficient spin torque is applied to the free layer, the magnetization of the free layer can be switched between two opposite directions and accordingly the MTJ can be switched between the parallel and antiparallel states depending on the direction of the DC current. The isolation/write transistor 520 controls the direction and magnitude of the DC current flowing through the MTJ 501. This control may be achieved by the relative voltages on the gate, source and drain of the transistor 520. The MTJ 501 may be implemented in various configurations, including the cell designs with the spin diffusion layers as described in this application.

In operation, the transistor 520 supplies both the write current for writing data by changing the magnetic state of the free layer in the MTJ 501 and the read current for reading data without changing the magnetic state of the free layer in the MTJ 501. Notably, the write current and the read current are both directed to flow through the MTJ 501 in a direction perpendicular to the layers and are different only in their relative magnitudes. Hence, there is a probability that the read current may inadvertently change the magnetization of the free layer. This phenomenon is the read-disturb effect and is undesirable.

Figure 6A:
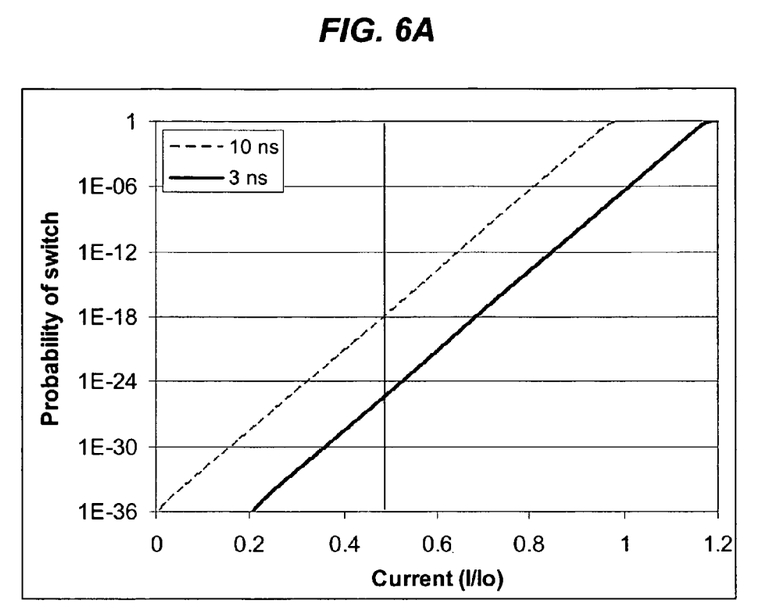
FIG. 6A shows the switching probability as a function of the normalized current applied to the MTJ based on spin-transfer switching for pulsed currents with two different pulse widths.

The probability of accidentally flipping a bit during read for pulse widths greater than 10 ns is given by the cumulative probability distribution as:

$$P\left(\frac{I}{I_0}\right) = 1 - \exp\left(\frac{-t_p}{t_0 \exp\left(\Delta\left(1 - \frac{I}{I_{c0}}\right)\right)}\right)$$

where $t_p$ is the time of the current pulse, $\Delta$ is the thermal factor, $K_u V/k_B T$, for the magnetic bit, I is the current of the pulse and $I_{c0}$ is the critical current at $t_0$. FIG. 6A shows the cumulative probability distribution for a sample with a $K_u V/k_B T$ of 85 for current pulses of 10 ns and 3 ns in their pulse widths assuming the 20% increase in $I_{c0}$. $I_{c0}$ in this case is defined by the extrapolation from long pulse widths. The switching probability distribution function is assumed to be unchanged for pulse width from 200 ps to 10 ns as is seen in the paper by Tulapurkar [A. A. Tulapurkar, T Devolder, K. Yagami, P. Crozat, C. Chappert, A. Fukushima and Y. Suzuki. Applied Physics Letters 85 5358 (2004)]. The dashed line represents the probability of switching the sample at 10 ns, which limits to 1 at $I/I_{c0}=1$. The solid line represents the probability of switching the sample with a 3-ns pulse, which limits to 1 and $I/I_{c0}=1.2$. Where the thin vertical line crosses the probability lines shows the reduction in the read-disturb probability by changing the read pulse from 10 ns to 3 ns.

Figure 6B:
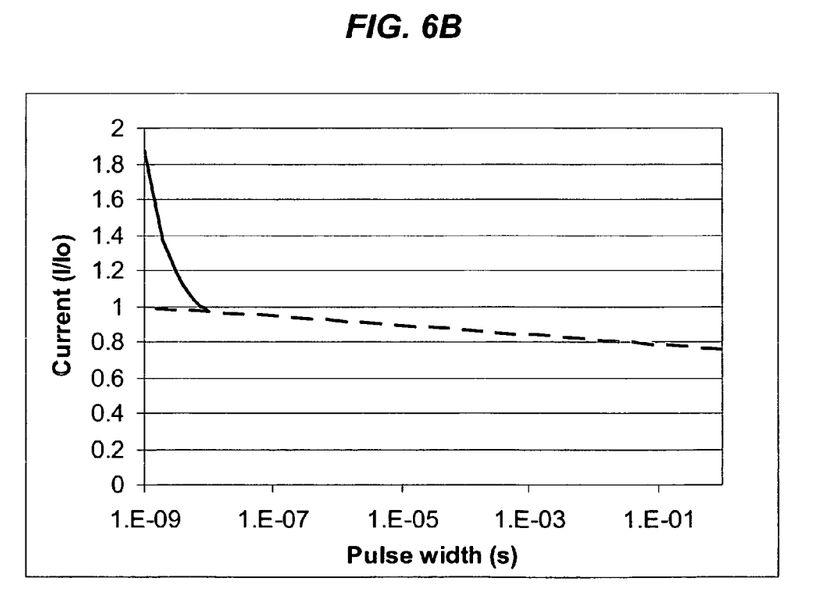
FIG. 6B shows the normalized current amplitude as a function of the pulse width of the current for switching the MTJ.

For pulses with a pulse width less than about 10 ns, the critical spin transfer switching current is usually not dominated by the thermal activation. Under this condition, the critical spin transfer switching current increases as the inverse of the pulse width for a given current pulse amplitude. Therefore, as shown in FIG. 6B, when the pulse width in time decreases, a large increase in the amplitude of the switching current is needed to flip the magnetization of the free layer. Accordingly, the reduction in the read-disturb probability can be achieved by changing the width of the read pulse from a pulse width of 10 ns used for writing to a smaller pulse width of 3 ns. The increase in the critical switching current corresponds to a decrease of several orders of magnitude in the read disturb probability. Therefore, in addition to controlling the current amplitudes of the current pulses between the read and write currents, the pulse width of the read current can be set to be smaller than the pulse width of the write current. Under this asymmetric read and writing pulse setting, the pulse amplitude and the pulse width of the read current are less than those of the write current to greatly reduce the read disturb error rate, creating a larger margin for high-density memory arrays, e.g., at mega and giga-bit scales. The pulse widths of 10 ns and 3 ns are used here as examples and actual pulse widths may be selected according to the specific properties the MTJ structures.

Figure 7A:
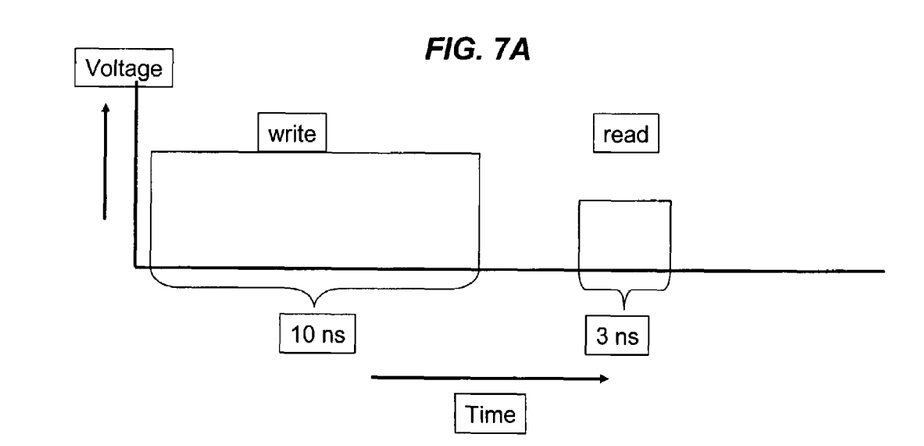
FIGS. 7A and 7B show two implementations of the asymmetric read and write currents for switching a MTJ with a reduced read disturb probability.
Figure 7B:
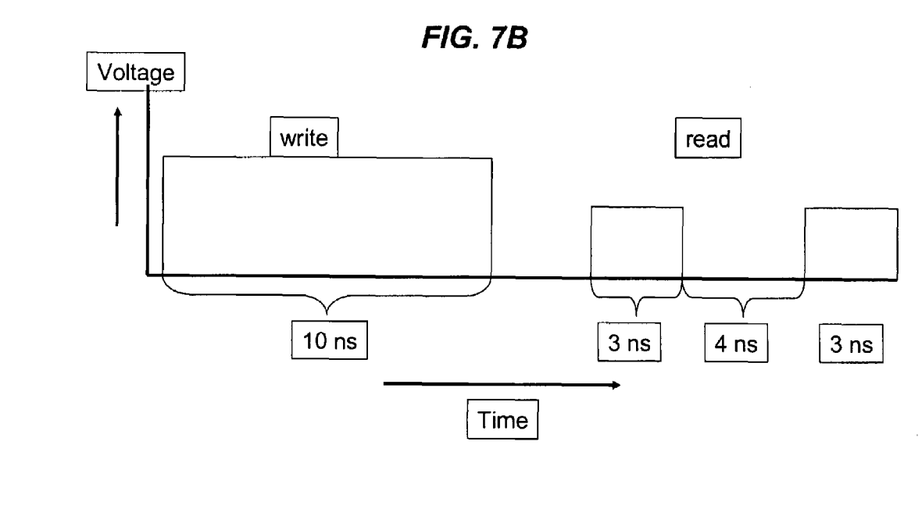

FIGS. 7A and 7B illustrate two examples of read and write schemes based on the above asymmetric read and writing pulse setting to reduce the read-disturb probability. A long writing pulse is used to switch bit while a much shorter reading pulse has a much smaller probability of flipping the bit. For multiple read pulse scheme, the access time of the memory cell may be considered in setting the pulse widths of the read and write currents. Due to the inherent RC time constants of the read circuitry the read pulse time must be long enough to overcome these times. In addition, multiple read pulses separated by a time greater than the relaxation time of the free ferromagnetic recording layer can be used to read the device without disturbing the bit. FIG. 7B shows a schematic of single 10 ns write pulse followed by a series of short, lower voltage (and current) read pulses. The read pulses are separated by a time comparable to the relaxation time allowing the magnetic state to approach equilibrium prior to the next pulse. In this manner, multiple pulses do not disturb the bit.

When the MTJ 501 in the device 500 in FIG. 5 is implemented with one or more spin diffusion layers to reduce the switching current density, the margin between the read and write currents of the spin transfer switching current for programming the bit reduces accordingly. This may lead to an increased read disturb probability. The above asymmetric pulse write/read scheme can be used to reduce the read disturb probability and to offset the loss of process margin due to the reduced spin transfer switching current.

Only a few examples have been disclosed. One of ordinary skill in the art can readily recognize that variations, modifications and enhancements to the described examples may be made.

What is claimed is:

1. A device, comprising:
   a free ferromagnetic layer having a magnetization direction that is changeable;
   a pinned ferromagnetic layer having a magnetization direction fixed along a predetermined direction;
   a middle layer formed between the free and pinned ferromagnetic layers;
   a spin diffusion layer located next to the free ferromagnetic layer and outside a structure formed by the free and pinned ferromagnetic layers and the middle layer, wherein the spin diffusion layer interacts with electrons to diffuse electron spins; and
   a diffusion barrier layer formed between the spin diffusion layer and the free ferromagnetic layer to separate the spin diffusion layer and the free ferromagnetic layer.

2. A device as in claim 1, wherein the middle layer is an insulator barrier layer formed between the free and pinned ferromagnetic layers to effectuate tunneling of electrons between the free and pinned ferromagnetic layers under a bias voltage across the insulator barrier layer.

3. A device as in claim 1, wherein the middle layer is a nonmagnetic metal spacer layer.

4. A device as in claim 1, wherein the spin diffusion layer comprises a material which exhibits a short spin diffusion length less than 102 angstroms.

5. A device as in claim 4, wherein the material comprises a non-magnetic metallic material.

6. A device as in claim 5, wherein the material comprises at least one of Pt, Pd, PtMn, Py, Au, Ag, V, Rd, and Ru.

7. A device as in claim 1, wherein the diffusion barrier layer comprises a non-magnetic metallic material.

8. A device as in claim 7, wherein the diffusion barrier layer comprises at least one of Ru, Ir, and Ta.

9. A device as in claim 1, wherein the middle layer is an insulator barrier layer formed between the free and pinned ferromagnetic layers to effectuate tunneling of electrons between the free and pinned ferromagnetic layers under a bias voltage across the insulator barrier layer, the device further comprising:
   a circuit to supply the bias voltage to inject an electric current through the free and pinned ferromagnetic layers and the insulator barrier layer; and
   a control mechanism which controls the circuit to (1) produce at least one write pulse with a first pulse amplitude and a first pulse width in the electric current when changing the magnetization direction of the free ferromagnetic layer, and (2) produce at least one read pulse with a second pulse amplitude and a second pulse width in the electric current when reading the magnetization direction of the free ferromagnetic layer without changing magnetization direction of the free ferromagnetic layer,
   wherein the second pulse width is less than the first pulse width and the second pulse amplitude is less than the first pulse amplitude.

10. A device as in claim 1, further comprising a second spin diffusion layer which interacts with electrons to diffuse electron spins, wherein the free and pinned ferromagnetic layers and the middle layer are between the spin diffusion layer and the second spin diffusion layer.

11. A device, comprising:
    a free ferromagnetic layer having a magnetization direction that is changeable;
    a pinned ferromagnetic layer having a magnetization direction fixed along a predetermined direction;
    a middle layer formed between the free and pinned ferromagnetic layers;
    a spin diffusion layer located next to the free ferromagnetic layer and outside a structure formed by the free and pinned ferromagnetic layers and the middle layer, wherein the spin diffusion layer interacts with electrons to diffuse electron spins; and
    a second spin diffusion layer which interacts with electrons to diffuse electron spins, wherein the free and pinned ferromagnetic layers and the middle layer are between the spin diffusion layer and the second spin diffusion layer.

12. A device as in claim 11, further comprising:
    a first diffusion barrier layer formed between the spin diffusion layer and the free ferromagnetic layer to separate the spin diffusion layer and the free ferromagnetic layer; and
    a second diffusion barrier layer formed between the pinned ferromagnetic layer and the second spin diffusion layer to separate the second spin diffusion layer and the pinned ferromagnetic layer.

13. A device as in claim 11, wherein the middle layer is an insulator barrier layer formed between the free and pinned ferromagnetic layers to effectuate tunneling of electrons between the free and pinned ferromagnetic layers under a bias voltage across the insulator barrier layer.

14. A device as in claim 11, wherein the middle layer is a non-magnetic metal spacer layer.

15. A device as in claim 11, wherein the spin diffusion layer comprises a material which exhibits a short spin diffusion length less than $10^2$ angstroms.

16. A device as in claim 15, wherein the material comprises a non-magnetic metallic material.

17. A device as in claim 16, wherein the material comprises at least one of Pt, Pd, PtMn, Py, Au, Ag, V, Rd, and Ru.

18. A device as in claim 11, further comprising:
an antiferromagnetic layer deposited adjacent to and magnetically coupled to pin the magnetization direction of the pinned ferromagnetic layer.

19. A device as in claim 18, wherein the antiferromagnetic layer is configured to interact with electrons to diffuse electron spins.

20. A device as in claim 19, wherein the antiferromagnetic layer comprises a material which exhibits a short spin diffusion length less than 102 angstroms.

21. A device as in claim 11, wherein the middle layer is an insulator barrier layer formed between the free and pinned ferromagnetic layers to effectuate tunneling of electrons between the free and pinned ferromagnetic layers under a bias voltage across the insulator barrier layer, the device further comprising:
a circuit to supply the bias voltage to inject an electric current through the free and pinned ferromagnetic layers and the insulator barrier layer; and
a control mechanism which controls the circuit to (1) produce at least one write pulse with a first pulse amplitude and a first pulse width in the electric current when changing the magnetization direction of the free ferromagnetic layer, and (2) produce at least one read pulse with a second pulse amplitude and a second pulse width in the electric current when reading the magnetization direction of the free ferromagnetic layer without changing magnetization direction of the free ferromagnetic layer, wherein the second pulse width is less than the first pulse width and the second pulse amplitude is less than the first pulse amplitude.

22. A device, comprising:
a free ferromagnetic layer having a magnetization direction that is changeable;
a pinned ferromagnetic layer having a magnetization direction fixed along a predetermined direction;
a middle layer formed between the free and pinned ferromagnetic layers;
a spin diffusion layer located next to the free ferromagnetic layer and outside a structure formed by the free and pinned ferromagnetic layers and the middle layer, wherein the spin diffusion layer interacts with electrons to diffuse electron spins;
an antiferromagnetic layer deposited adjacent to and magnetically coupled to pin the magnetization direction of the pinned ferromagnetic layer; and
a second spin diffusion layer which interacts with electrons to diffuse electron spins, wherein the antiferromagnetic layer is between the pinned ferromagnetic layer and the second spin diffusion layer.

23. A device as in claim 22, wherein the antiferromagnetic layer is configured to interact with electrons to diffuse electron spins.

24. A device as in claim 23, wherein the antiferromagnetic layer comprises a material which exhibits a short spin diffusion length less than $10^2$ angstroms.

25. A device as in claim 22, further comprising a diffusion barrier layer formed between the second spin diffusion layer and the antiferromagnetic layer to separate the second spin diffusion layer and the antiferromagnetic layer.

26. A device as in claim 22, further comprising:
a second free ferromagnetic layer having a magnetization direction that is changeable and located next to the spin diffusion layer so that the spin diffusion layer is between the free ferromagnetic layer and the second free ferromagnetic layer;
a second pinned ferromagnetic layer having a magnetization direction fixed along a predetermined direction; and
a second middle layer formed between the second free and the second pinned ferromagnetic layers.

27. A device as in claim 22, wherein the middle layer is an insulator barrier layer formed between the free and pinned ferromagnetic layers to effectuate tunneling of electrons between the free and pinned ferromagnetic layers under a bias voltage across the insulator barrier layer.

28. A device as in claim 22, wherein the middle layer is a non-magnetic metal spacer layer.

29. A device as in claim 22, wherein the spin diffusion layer comprises a material which exhibits a short spin diffusion length less than $10^2$ angstroms.

30. A device as in claim 29, wherein the material comprises a non-magnetic metallic material.

31. A device as in claim 30, wherein the material comprises at least one of Pt, Pd, PtMn, Py, Au, Ag, V, Rd, and Ru.

32. A device as in claim 22, further comprising:
an antiferromagnetic layer deposited adjacent to and magnetically coupled to pin the magnetization direction of the pinned ferromagnetic layer.

33. A device as in claim 32, wherein the antiferromagnetic layer is configured to interact with electrons to diffuse electron spins.

34. A device as in claim 33, wherein the antiferromagnetic layer comprises a material which exhibits a short spin diffusion length less than $10^2$ angstroms.

35. A device as in claim 22, wherein the middle layer is an insulator barrier layer formed between the free and pinned ferromagnetic layers to effectuate tunneling of electrons between the free and pinned ferromagnetic layers under a bias voltage across the insulator barrier layer, the device further comprising:
a circuit to supply the bias voltage to inject an electric current through the free and pinned ferromagnetic layers and the insulator barrier layer; and
a control mechanism which controls the circuit to (1) produce at least one write pulse with a first pulse amplitude and a first pulse width in the electric current when changing the magnetization direction of the free ferromagnetic layer, and (2) produce at least one read pulse with a second pulse amplitude and a second pulse width in the electric current when reading the magnetization direction of the free ferromagnetic layer without changing magnetization direction of the free ferromagnetic layer, wherein the second pulse width is less than the first pulse width and the second pulse amplitude is less than the first pulse amplitude.

* * * * *

UNITED STATES PATENT AND TRADEMARK OFFICE
CERTIFICATE OF CORRECTION

PATENT NO. : 7,430,135 B2
APPLICATION NO. : 11/318337
DATED : September 30, 2008
INVENTOR(S) : Yiming Huai It is certified that error appears in the above-identified patent and that said Letters Patent is hereby corrected as shown below:

Column 10, line 2, (Claim 3) delete "nonmagnetic" and insert --non-magnetic--;

Column 10 line 5, (Claim 4) delete "102" and insert --$10^2$--;

Column 11, line 22, (Claim 20) delete "102" and insert --$10^2$--.

Signed and Sealed this

Twenty-fifth Day of November, 2008

JON W. DUDAS
*Director of the United States Patent and Trademark Office*